United States Patent
Lee et al.

(10) Patent No.: US 7,622,778 B2
(45) Date of Patent: Nov. 24, 2009

(54) SEMICONDUCTOR DEVICE HAVING SHALLOW TRENCH ISOLATION STRUCTURE COMPRISING AN UPPER TRENCH AND A LOWER TRENCH INCLUDING A VOID

(75) Inventors: Sung-Sam Lee, Gyeonggi-do (KR); Gyo-Young Jin, Seoul (KR); Yun-Gi Kim, Gyeonggi-do (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 11/383,141

(22) Filed: May 12, 2006

(65) Prior Publication Data

US 2006/0263991 A1 Nov. 23, 2006

(30) Foreign Application Priority Data

May 18, 2005 (KR) .................... 10-2005-0041761

(51) Int. Cl.
*H01L 23/62* (2006.01)
(52) U.S. Cl. .................. 257/374; 257/510; 257/524; 257/E21.546; 257/E21.549; 257/E21.564
(58) Field of Classification Search .............. 257/510, 257/524, 374, E21.546, E21.549, E21.564
See application file for complete search history.

(56) References Cited

U.S. PATENT DOCUMENTS

| 4,264,382 A | 4/1981 | Anantha et al. |
| 4,356,211 A | 10/1982 | Riseman |
| 4,456,501 A * | 6/1984 | Bayman et al. ............. 438/704 |
| 6,001,705 A | 12/1999 | Zombrano |
| 6,251,750 B1 * | 6/2001 | Lee ............................ 438/432 |

(Continued)

FOREIGN PATENT DOCUMENTS

JP 2001-244325 9/2001

(Continued)

OTHER PUBLICATIONS

English language abstract of Korean Publication No. 1999-0073644, Jan. 29, 2007.

(Continued)

*Primary Examiner*—Bradley K Smith
*Assistant Examiner*—Mohammad T Karimy
(74) *Attorney, Agent, or Firm*—Marger Johnson & McCollom, P.C.

(57) ABSTRACT

In one embodiment, a semiconductor device has an active region defined by an isolation layer formed inside an STI trench that includes an upper trench and a lower trench having a substantially curved cross-sectional profile under the upper trench so that the lower trench is in communication with the upper trench. Since the upper trench has a sidewall tapered with a positive slope, a good gap filling property can be obtained when filling the upper trench with an insulating layer. By forming a void in the lower trench, a dielectric constant at the bottom of the isolation layer is lower than a dielectric constant at an oxide layer, thereby improving the isolation property. The isolation layer includes a first insulating layer formed inside only the upper trench and covering an inner wall of the upper trench in the form of a spacer.

15 Claims, 9 Drawing Sheets

U.S. PATENT DOCUMENTS

| | | | |
|---|---|---|---|
| 6,297,554 B1 * | 10/2001 | Lin | 257/752 |
| 6,313,008 B1 * | 11/2001 | Leung et al. | 438/424 |
| 6,406,975 B1 | 6/2002 | Lim et al. | |
| 6,882,025 B2 * | 4/2005 | Yeo et al. | 257/510 |
| 7,015,116 B1 * | 3/2006 | Lo et al. | 438/437 |
| 2002/0171118 A1 * | 11/2002 | Mandelman et al. | 257/510 |
| 2003/0013272 A1 * | 1/2003 | Hong et al. | 438/437 |
| 2003/0089939 A1 * | 5/2003 | Lee et al. | 257/306 |

FOREIGN PATENT DOCUMENTS

| | | |
|---|---|---|
| JP | 2002-319638 | 10/2002 |
| KR | 1999-0073644 | 10/1999 |
| KR | 2001-0001202 | 1/2001 |
| KR | 10-2005-0028618 | 3/2005 |

OTHER PUBLICATIONS

English language abstract of Korean Publication No. 2001-0001202, May 1, 2001.

English language abstract of Japanese Publication No. 2001-244325, Jul. 9, 2001.

* cited by examiner

SEMICONDUCTOR DEVICE HAVING SHALLOW TRENCH ISOLATION STRUCTURE COMPRISING AN UPPER TRENCH AND A LOWER TRENCH INCLUDING A VOID

CROSS-REFERENCE TO RELATED PATENT APPLICATION

This application claims the benefit of Korean Patent Application No. 10-2005-0041761, filed on May 18, 2005, in the Korean Intellectual Property Office, the disclosure of which is incorporated herein in its entirety by reference.

1. Field of the Invention

The present invention relates to a semiconductor integrated circuit device and a method of its manufacture, and more particularly, to a semiconductor device having a shallow trench isolation structure (STI) and a method of its manufacture.

2. Description of the Related Art

As semiconductor integration increases, an isolation technology for electrically isolating adjacent devices becomes more important. A shallow trench isolation (STI) formation process is a widely used isolation technology in manufacturing of high integration semiconductor devices. The STI formation process is used to form a trench defining an active region on a semiconductor substrate and to form an isolation layer by filling the trench with an insulating material.

Various scaling technologies for manufacturing highly integrated semiconductor devices have been developed. Also, because CMOS devices are manufactured using 70 nm technology or less, it becomes more difficult to form their STI structures. In an isolation process using STI, an STI trench is formed with tapered sidewalls with a positive slope, so that the STI trench can be sufficiently and readily filled with an isolating material. That is, the top of the trench is wider than the bottom of the trench. However, as device size decreases, the aspect ratio of an STI trench increases. The slope of such an STI trench with the increased aspect ratio is reduced and an isolation property deteriorates. Moreover, the shape and depth of the STI trench vary according to positions on a wafer.

Additionally, after forming an STI trench, an oxidation process for the trench sidewalls is performed before filling the trench with an insulating material. An active region of a substrate is consumed by oxidation during the oxidation process for the trench sidewalls. Consequently, it becomes more difficult to ensure an effective region of an active region for a sufficient process margin. Excessive oxidation occurs around a top of the trench entry when the trench sidewalls are oxidized. Therefore, resistance of a contact pad or a source/drain region formed in the active region adjacent to the top of the trench increases and a current of a cell transistor decreases. As a result, the performance of a unit device deteriorates and a malfunction of a device may occur.

SUMMARY

The present invention provides a semiconductor device having an isolation structure that can provide a stable isolation property, effectively prevent a hot electron induced punchthrough (HEIP) effect, and increase the region of an active region.

The present invention also provides a method of manufacturing a semiconductor device, capable of restraining consumption of an active region by oxidation, providing easy trench filling, and providing a stable isolation structure.

According to an embodiment of the present invention, a semiconductor device includes: a semiconductor substrate having an upper trench and a lower trench to define an active region, the lower trench having a substantially curved or round-shaped cross-sectional profile under the upper trench so that the lower trench is in communication with the upper trench; and an isolation layer formed inside the upper trench and the lower trench of the semiconductor substrate, the isolation layer including: a first insulating layer formed inside only the upper trench and covering an inner wall of the upper trench in a form of a spacer; a second insulating layer surrounded by the first insulating layer and buried inside the upper trench; and a third insulating layer covering an inner wall of the lower trench so as to define a closed void inside the lower trench.

The upper trench may have a first width at an upper portion and a second width at a lower portion, the first width being greater than the second width, and the lower trench may have a third width corresponding to a maximum width of the lower trench, the third width being greater than the second width. The isolation layer may be formed on the semiconductor substrate to define a plurality of active regions in an island shape having a major axis extending in a first direction and a minor axis extending in a second direction perpendicular to the first direction on a main surface of the semiconductor substrate, and the third width may be less than the first width in a minor axis direction of the active region.

The upper trench may have an inner wall tapered with a positive slope.

According to another embodiment of the present invention, a method of manufacturing a semiconductor device includes: forming an upper trench by etching a predetermined region of a semiconductor substrate; performing an isotropic dry etching process on the bottom of the upper trench, thereby forming a lower trench in communication with the upper trench via the bottom of the upper trench and having a substantially curved or round-shaped cross-sectional profile; and filling the upper trench and partially filling the lower trench with an insulating layer to form an isolation trench having a closed void within the lower trench.

The forming of the upper trench may include performing an anisotropic dry etching process on the semiconductor substrate such that a first width at an upper portion of the upper trench is greater than a second width at a lower portion thereof. The lower trench may be formed using an isotropic dry etching.

The forming of the lower trench may be performed in-situ with the forming of the insulating spacer.

The upper trench has a good gap filling property when filling an STI trench with an insulating layer for isolation. Additionally, by forming a void with a lower dielectric constant than that of the conventional oxide layer inside the lower trench according to deposition conditions of an insulating layer for isolation, an isolation property can be improved. An isolation region can improve the depth variation of trench for isolation formed on a various positions of the entire surface in a wafer by forming a lower trench to have a substantially curved or round-shaped cross-sectional profile using an isotropic dry etching process. The region of an active region increases and an electric property is improved by forming a spacer of an oxide layer in an inner wall of the upper trench.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Some embodiments of the present invention will now be described more fully with reference to the accompanying drawings, in which exemplary embodiments of the invention are illustrated. One skilled in the art should appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 1:
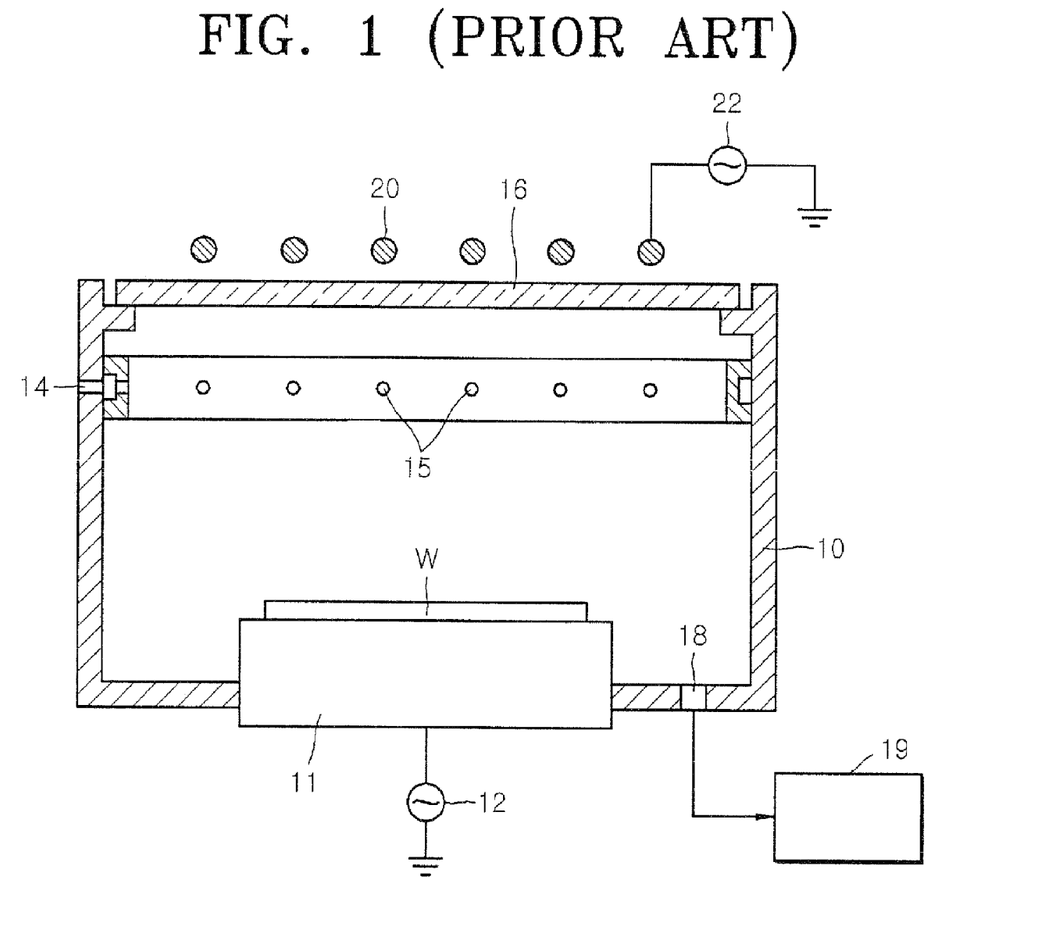
FIG. 1 is a schematic view of an ICP etching apparatus.

An isolation layer defining an active region on a semiconductor substrate is formed using an STI technology. The isolation layer is formed inside an STI trench formed by etching a region of a semiconductor substrate. The STI trench includes an upper trench and a lower trench. The lower trench is connected to the upper trench via the bottom of the upper trench and has a substantially curved or round-shaped cross-sectional profile. An insulating spacer may be formed to cover an inner wall of the upper trench. An etching process for forming the insulating spacer and an etching process for forming the lower trench may be performed in situ in the same chamber (maybe without breaking a vacuum). This etching process may be performed using, for example, an inductively coupled plasma (ICP) etching apparatus. After forming the insulating spacer, an isotropic dry etching process can be used for the in-situ formation of the lower trench. FIG. 1 is a schematic view of a typical ICP etching apparatus.

Referring to FIG. 1, a process chamber 10 with a plasma forming space is disposed inside the ICP etching apparatus. A susceptor 11 is disposed in an inside lower section of the process chamber 10, and supports a substrate, i.e., a wafer W, to be processed. A bias power source 12 is connected to the susceptor 11. A dielectric window 16 is installed at the top of the process chamber 10. A gas inlet 14 is formed at a sidewall of the process chamber 10 to inject a reaction gas into the process chamber 10. A plurality of gas distribution ports 15 connected with the gas inlet 14 are formed inside the process chamber 10. A vacuum inlet 18 is formed at the bottom of the process chamber 10 to connect with a vacuum pump 19 to create a vacuum inside the process chamber 10. A plurality of TCP antennas 20 are disposed above the dielectric window 16 to generate plasma inside the process chamber 10. A power source 22 is connected to the ICP antenna 20 and an RF current flows through the antenna 20. A magnetic field is generated by the RF current and a concomitant electric field is induced according to variations in the magnetic field with respect to time. At the same time, the reaction gas flows into the process chamber 10 through the gas distribution ports 15, and electrons accelerated by the induced electric field produce plasma inside the process chamber 10 by ionizing reaction gas through a collision process. Chemical reactions between the plasma and the wafer W cause the plasma to etch a surface of the wafer W.

FIGS. 2A through 2H are cross-sectional views of sequential processes of fabricating a semiconductor device according to one embodiment of the present invention.

Figure 2A:
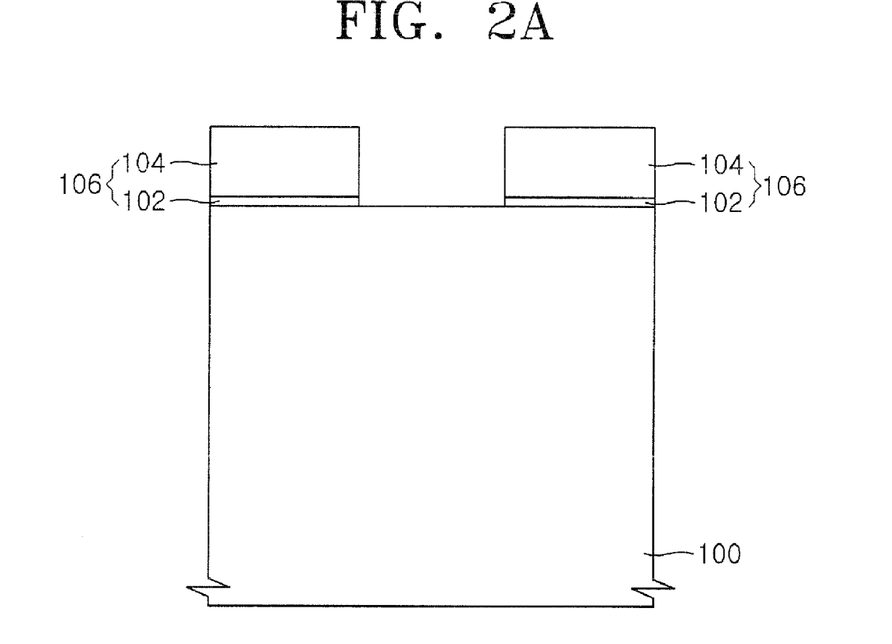
FIGS. 2A through 2H are cross-sectional views explaining sequential processes of manufacturing a semiconductor device according to a preferred embodiment of the present invention.

Referring to FIG. 2A, a pad oxide layer 102 is formed on a semiconductor substrate 100 and a nitride layer 104 is formed on the pad oxide layer 102. A mask pattern 106 is formed by patterning the nitride layer 104 and the pad oxide layer 102 using a photolithography process with a photomask pattern defining an active region.

Figure 2B:
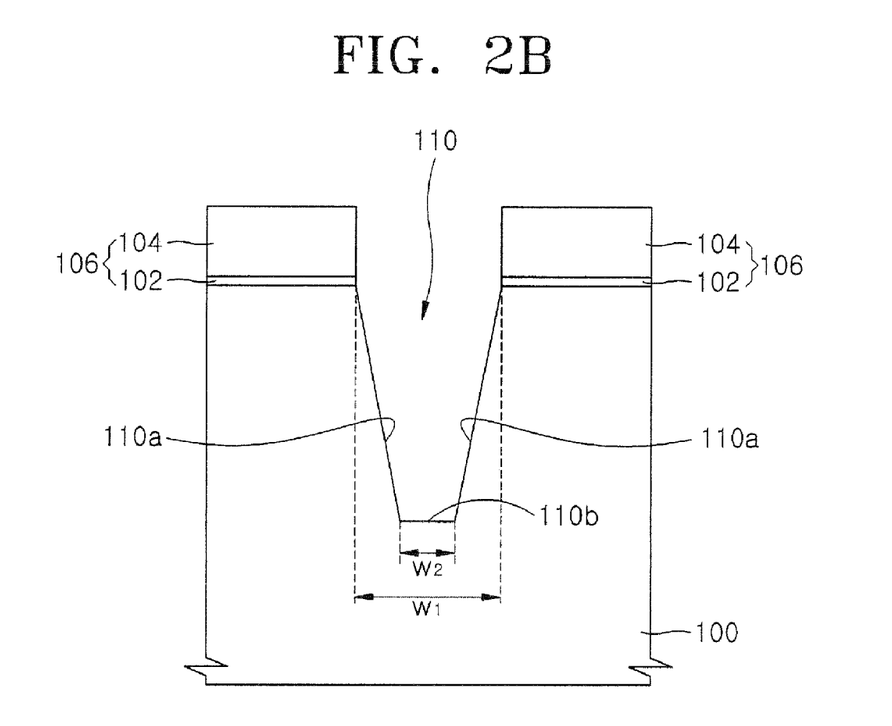

Referring to FIG. 2B, the mask pattern 106 forms an upper trench 110 by etching an exposed region of the semiconductor substrate 100 to a certain depth using an etching mask. For example, the ICP etching apparatus illustrated in FIG. 1 can be used to etch and form the upper trench 110. A breakthrough (BT) process and a main etching process, for example, are performed by the ICP etching apparatus to eliminate any native oxide layer remaining on the surface of the semiconductor substrate 100. To have an excellent gap filling property in a subsequent process of filling the upper trench 110 with an insulating material for an isolation layer, it is desirable to control etching conditions to form a tapered sidewall 110a with a positive slope inside the upper trench 110 during the main etching process. Preferably, the upper trench 110 can be formed with a tapered sidewall having a slope of about 88°. As mentioned above, a first width $W_1$ at the top of the upper trench 110 is greater than a second width $W_2$ at the bottom 110b of the upper trench 110 by virtue of the tapered sidewall ($W_1 > W_2$).

The power source 22 and the bias power source 12 maintain power-on states when the ICP etching apparatus forms the upper trench 110. The BT process using the ICP etching apparatus can be performed using the following parameters, for example:

Pressure of etching atmosphere: 20 mTorr;

Source power: 600 W;

Bias power: 1000 W;

Etching atmosphere gas and flow rate: $CF_4$ (50 sccm)/Ar (150 sccm); and

Etching time: 11 seconds.

These parameters can be modified according to the type, size, and other related specifications of the device to be formed.

When the ICP etching apparatus is used in the main etching process for forming the upper trench 110, the main etching process can be performed using the following parameters, for example:

Pressure of etching atmosphere: 50 mTorr;
Source power: 600 W;
Bias power: 225 W;
Etching atmosphere gas and flow rate: $Cl_2$ (200 sccm)/HBr (200 sccm)/$O_2$ (6 sccm); and
Etching time: 25 seconds.

These parameters can be modified according to the type, size, and other related specifications of the device to be formed.

Figure 2C:
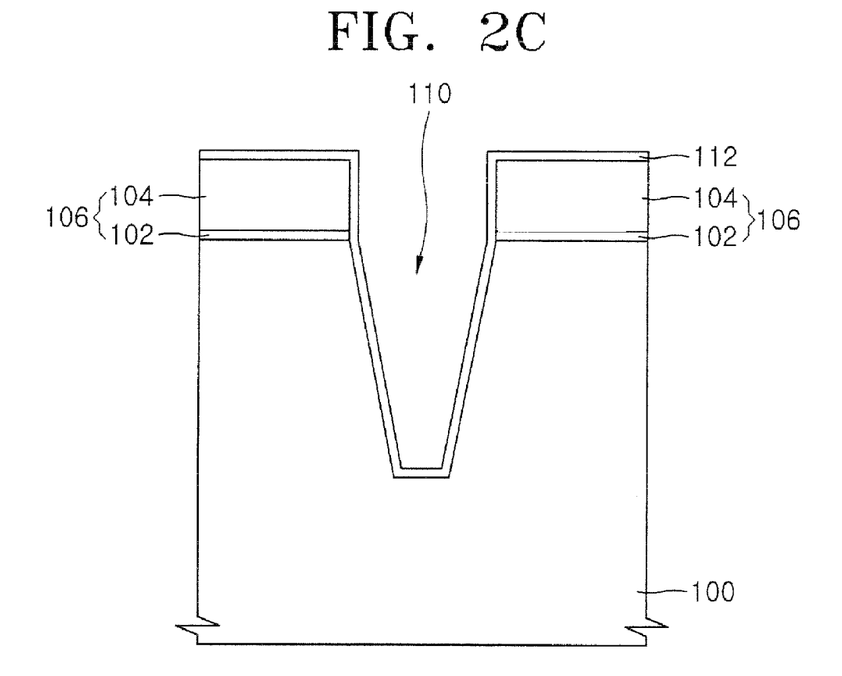

Referring to FIG. 2C, an insulating layer such as an oxide layer 112 is formed on substantially the entire surface of the semiconductor substrate 100 having the upper trench 110. For example, the oxide layer 112 can be made of a medium temperature oxide deposition (MTO) layer deposited at about 800° C. using a low pressure chemical vapor deposition (LPCVD) method. For example, the oxide layer 112 can be formed to be about 40-50 Å thick.

Figure 2D:
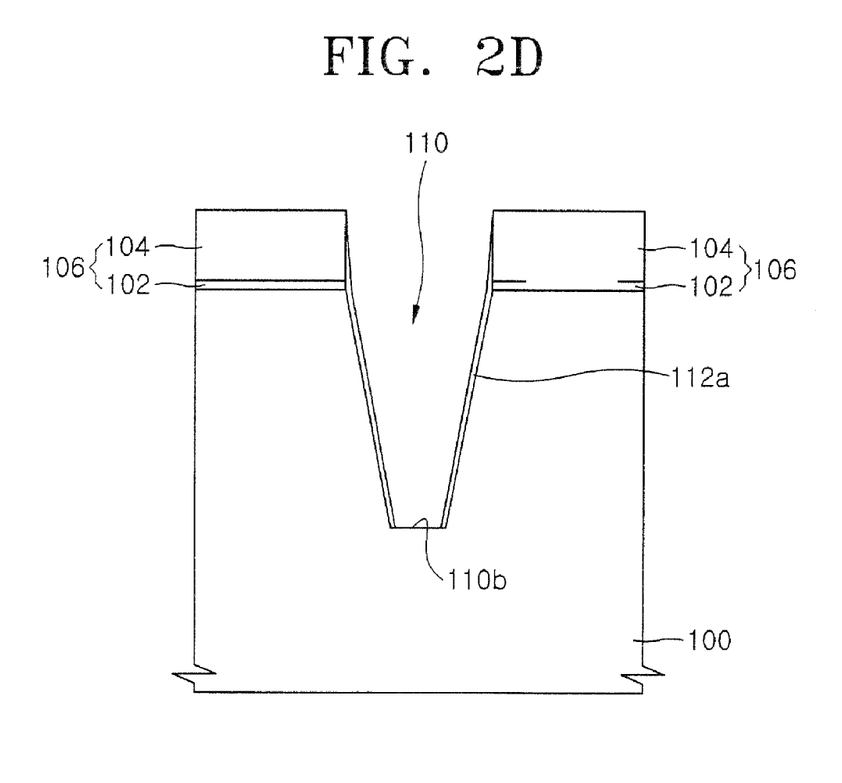

Referring to FIG. 2D, the semiconductor substrate 100 is exposed by eliminating a portion of the oxide layer 112 on the bottom 110b of the upper trench 110. An insulating spacer such as an oxide layer spacer 112a is formed by the remainder of the oxide layer 112 at the sidewalls. The BT process using the ICP etching apparatus can be performed to achieve the above.

The BT process using the ICP etching apparatus can be used to form the oxide layer spacer 112a using the following parameters, for example:

Pressure of etching atmosphere: 5 mTorr;
Source power: 300 W;
Bias power: 150 W; Etching atmosphere gas and flow rate: $CF_4$ (50 sccm)/Ar (100 sccm); and
Etching time: 5 seconds.

These parameters can be modified according to the type, size, and other related parameters of the device to be formed.

Figure 2E:
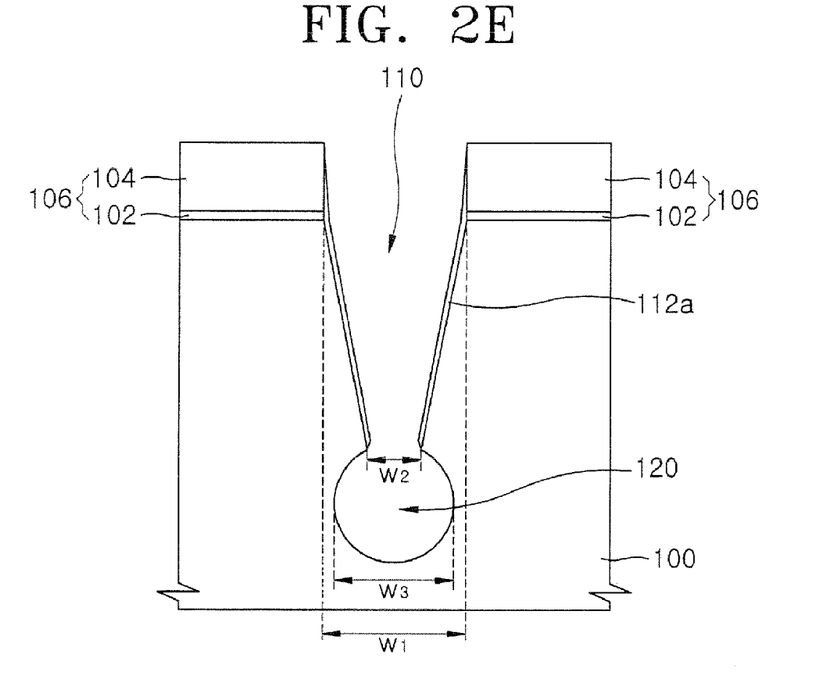

Referring to FIG. 2E, an isotropic dry etching process may be performed on the bottom 110b of the upper trench 110, using the oxide layer spacer 112a as an etching mask, preferably in-situ, thereby forming a lower trench 120 in communication with the upper trench 110. Consequently, an STI trench including the upper trench 110 and the lower trench 120 is formed. Since the lower trench 120 is formed by an isotropic dry etching process, it has a substantially round-shaped or curved cross-sectional profile. The cross-sectional profile of the lower trench 120 can be formed in a substantially round-shape or an elliptical shape by controlling a repetitive simulation of the isotropic dry etching conditions. The substantially curved cross-sectional profile of the lower trench 120 may represent a generally circular arc.

The isotropic dry etching process used to form the lower trench 120 can be performed by the ICP etching apparatus illustrated in FIG. 1. In this case, the power source 22 maintains a power-on state and the bias power source 12 maintains a power-off state. For example, the isotropic dry etching process using the ICP etching apparatus illustrated in FIG. 1 can be performed using the following parameters:

Pressure of etching atmosphere: 20 mTorr;
Power source: 350 W;
Bias power source: 0 W;
Etching atmosphere gas and flow rate: $Cl_2$ (150 sccm)/$SF_6$ (15 sccm)/$O_2$ (10 sccm); and
Etching time: 7 seconds.

These parameters can be modified according to the type, size, and other related specifications of the device to be formed.

A third width $W_3$, which is the maximum width of the lower trench 120, is greater than the second width $W_2$ of the bottom of the upper trench 110. Under different conditions, the third width $W_3$ can be greater or less than the first width $W_1$ of the top of the upper trench 110. A detailed description of these widths will be described later.

It is convenient to control the depth uniformity of the STI trench on a wafer in forming an isolation layer using the STI process because the lower trench has the substantially curved or round-shaped cross-sectional profile. For example, it is unnecessary to apply rigid field engineering for maintaining an existing trench depth when forming an isolation region for high-scale device fabrication. Additionally, it is possible to reduce an electric field enhancement effect caused by sharpness of a trench bottom in the prior art.

Figure 2F:
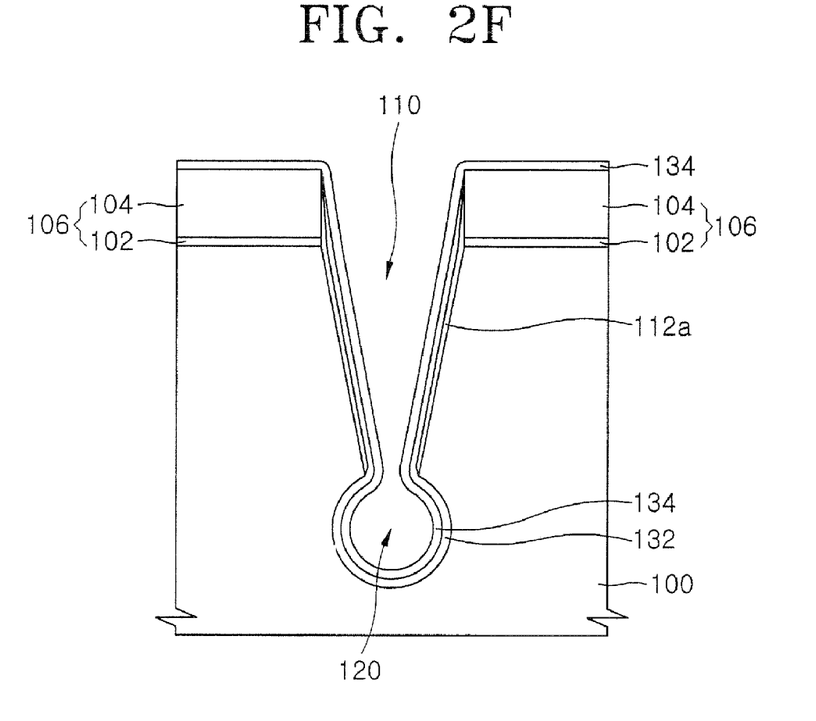

Referring to FIG. 2F, an insulating layer such as an oxide layer 132 may be formed to cover the surface of the oxide layer spacer 112a in the upper trench 110 and an inner wall of the lower trench 120. The oxide layer 132 can be formed by using conventional techniques such as a thermal oxidation process. When the oxide layer 132 is grown by the thermal oxidation process, a portion to be consumed by oxidation can be minimized in an active region of the semiconductor substrate 100 around the top of the upper trench. This is because the oxide layer spacer 112a of a predetermined thickness is already located between the semiconductor substrate 1100 surrounding the upper trench 110 and the growing oxide layer 132. Resistance can then decrease in a contact pad region or a source/drain region to be formed on the active region, and the current of a cell transistor can increase.

Then, nitridation is performed on the semiconductor substrate 100 and its upper structure to form a nitride liner 134 on the oxide layer 132 inside the upper trench 110 and the lower trench 120. The nitridation can be performed using a thermal nitridation process using a furnace, for example.

Figure 2G:
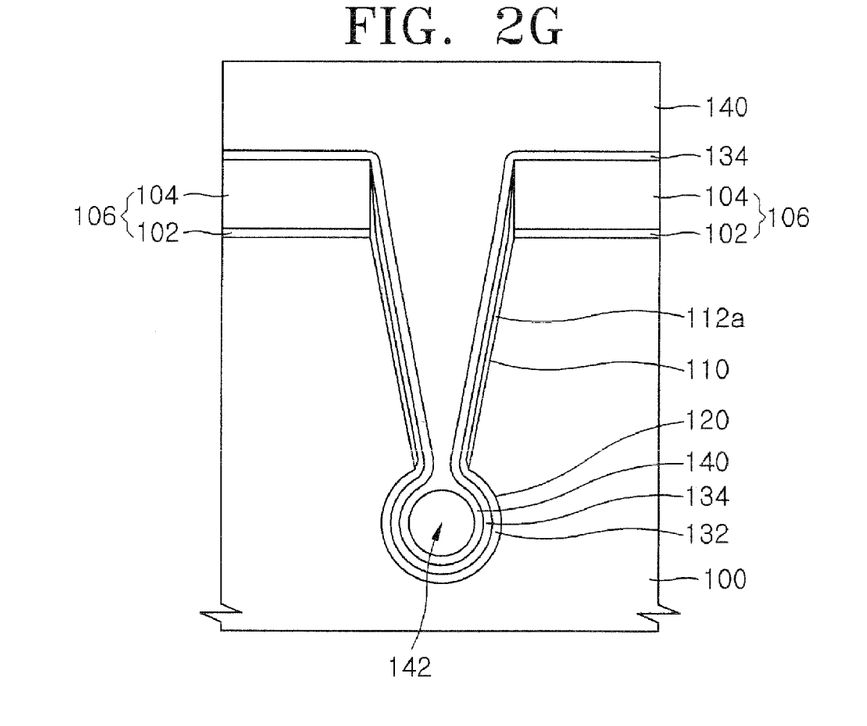

Referring to FIG. 2G, an insulating layer 140 is formed over the resulting structure to fill a region defined by the nitride liner 134. Sidewalls of the upper trench 110 have a tapered sidewall 110a with a positive slope. Therefore, when the region is filled with the insulating layer 140, reduction of a gap fill margin is minimized.

Though the insulating layer 140 may be formed to fill the upper trench 110 and the lower trench 120, it is preferable that only the upper trench 110 is filled so that a closed void 142 is formed inside the lower trench 120 as illustrated in FIG. 2G. When the void 142 is formed in the lower trench 120, a dielectric constant in the void 142 is less than a dielectric constant in a typical nitride layer (e.g., an oxide layer). Therefore, the amount of induced charge is reduced and thus a good isolation characteristic can be obtained. Though a small amount of the insulating layer 140 is deposited in the lower trench 120 in FIG. 2G, the present invention is not limited to this structure. For example, the insulating layer 140 may not be deposited in the lower trench 120, or the void 142 may not be formed by filling the lower trench 120 completely.

The insulating layer 140 can be formed of high density plasma (HDP) using a CVD method, or a spin-on-glass (SOG)-based oxide layer such as tetraethylorthosilicate glass (TEOS) formed using a plasma-enhanced CVD (PECVD) method and an undoped silicate glass (USG) layer.

Figure 2H:
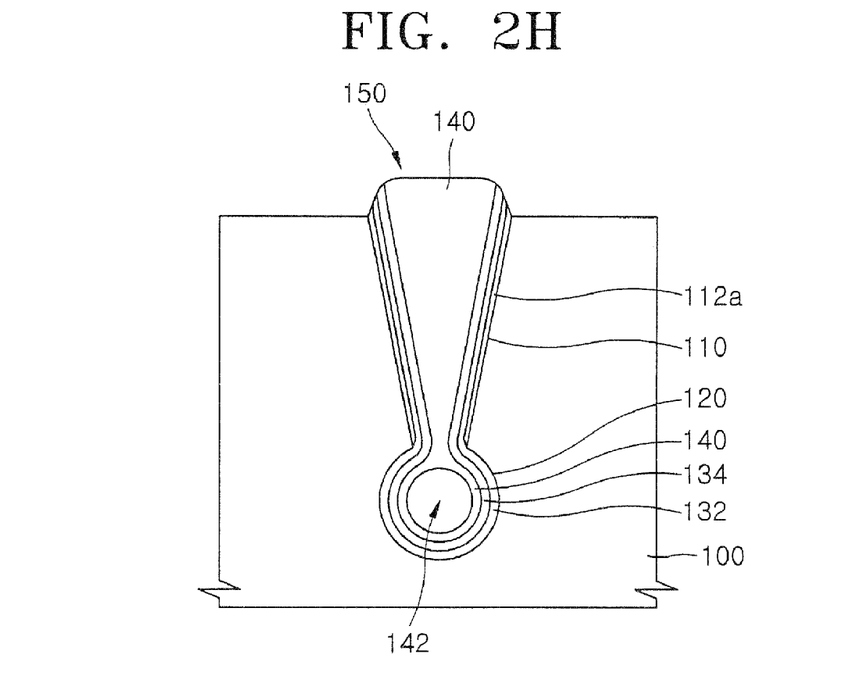

Referring to FIG. 2H, a chemical mechanical polishing (CMP) process is performed until the nitride layer 104 in FIG. 2G is exposed. Then, the exposed nitride layer 104 is eliminated using a wet etching process using phosphoric acid and unnecessary layers are removed using a cleaning process, and an isolation layer 150 is formed.

The isolation layer 150 of the semiconductor device according to an embodiment of the present invention is relatively thicker than that of the prior art because the oxide layer 132 is formed on the oxide layer spacer 112*a* inside the upper trench 110. Consequently, a phenomenon of trench trap charges, which can be caused by the nitride liner 134, is minimized and thus a hot electron induced punchthrough (HEIP) effect can be prevented. Considering the amount of consumed oxide layer used in a plurality of cleaning processes during subsequent processes of forming a gate electrode, a sufficient margin for a cleaning process can be secured because the total thickness of the sidewall oxide layer in the isolation layer 150 increases. Accordingly, the possibility of a dent formation between the isolation layer and the active region can be minimized.

Figure 3:
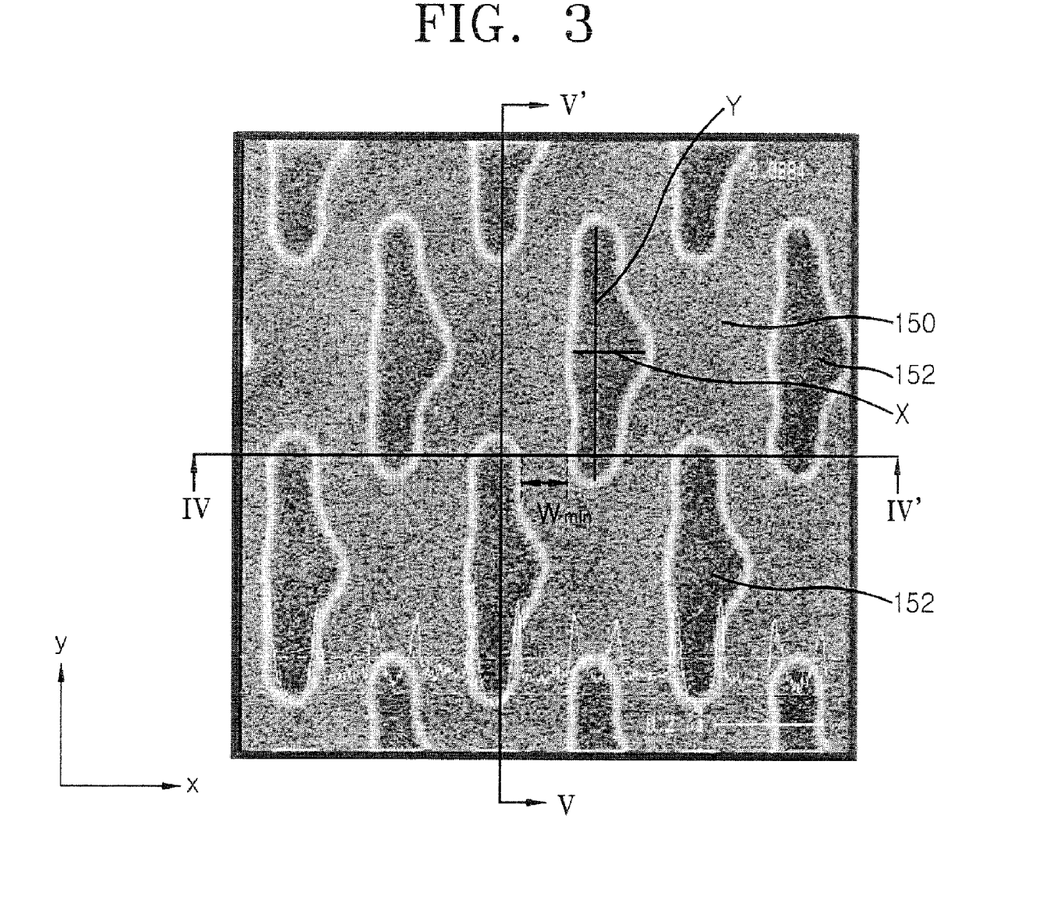
FIG. 3 is a SEM image illustrating an exemplary planar structure of an active region pattern defined by an isolation layer according to one embodiment of the present invention.

FIG. 3 is a scanning electron microscope (SEM) image illustrating an exemplary planar structure of an active region pattern 152 defined by an isolation layer 150 formed on a semiconductor substrate according to an aspect of the present invention.

Referring to FIG. 3, a plurality of the active region patterns 152 defined by the isolation layer 150 are formed on a main surface of the semiconductor substrate. The active region pattern 152 has an island shape having a major axis Y extending in a first direction (y direction in FIG. 3) and a minor axis X extending perpendicular to the first direction (x direction in FIG. 3).

Figure 4:
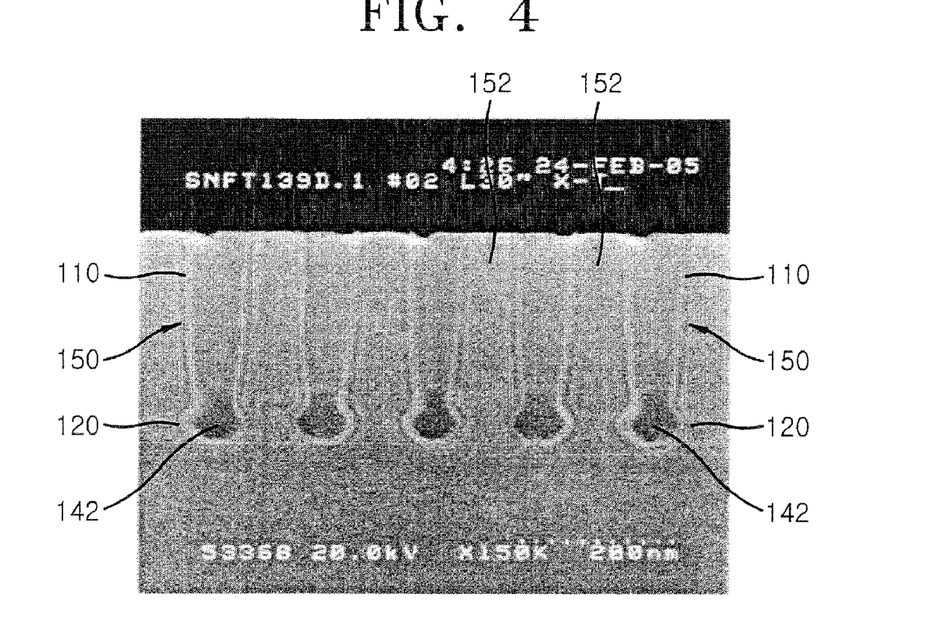
FIG. 4 is a SEM image illustrating a cross-sectional structure in a direction of a minor axis in an active region according to another embodiment of the present invention.

FIG. 4 is a SEM image illustrating a cross-sectional structure in a minor axis direction in an active region pattern 152 according to an aspect of the present invention. Moreover, FIG. 4 is a cross-sectional view taken along line IV-IV' in FIG. 3, that is, a cross-sectional view of the isolation layer 150 in a minor axis X direction of the active region pattern 152.

Referring to FIG. 4, a void 142 is formed inside the lower trench 120 of the isolation layer 150. Additionally, the maximum width of the lower trench 120 is less than the width of the top of the upper trench 10 and greater than the width of the bottom of the upper trench 110.

Figure 5:
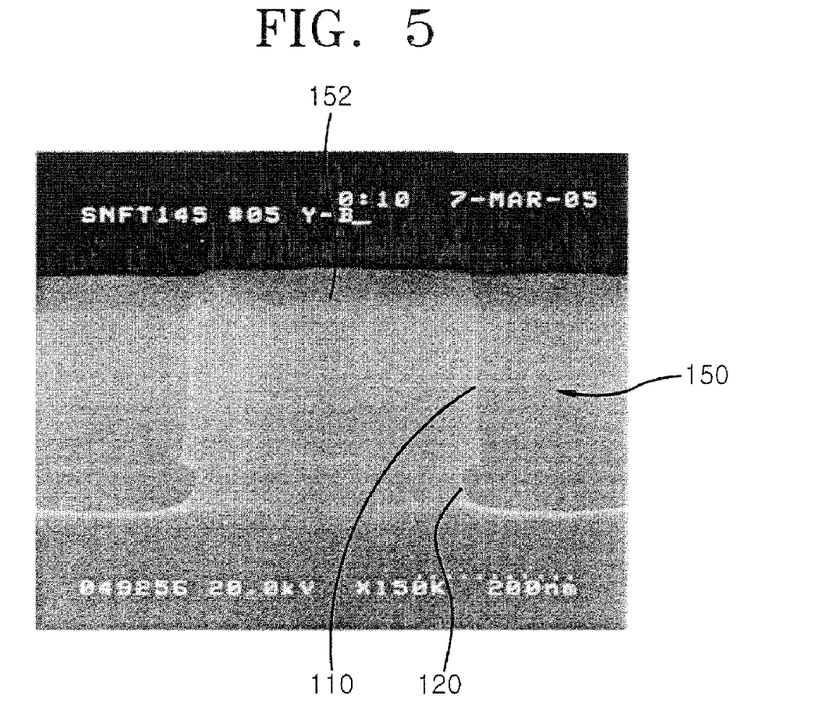
FIG. 5 is a SEM image illustrating a cross-sectional structure in a major axis direction in an active region according to yet another embodiment of the present invention.

FIG. 5 is a SEM image illustrating a cross-sectional structure in a major axis direction in an active region according to an aspect of the present invention. Moreover, FIG. 5 is a cross-sectional view taken along line V-V' in FIG. 3, that is, a cross-sectional view of the isolation layer 150 in a major axis Y direction of the active region pattern 152.

Referring to FIG. 5, the maximum width of the lower trench 120 of the isolation layer 150 is greater than the width of the top of the upper trench 110.

Referring to FIGS. 4 and 5, the maximum width of the lower trench 120 in a major axis Y direction of the active region pattern 152 is greater than the width of the lower trench 120 in a minor axis X direction of the active region pattern 152. This structure results from the consequence of a loading effect. The loading effect is caused by the difference of a pattern density in the active region pattern 152 of the semiconductor substrate during the isotropic dry etching process of forming the lower trench 120 described above referring to FIG. 2E. An amount to be consumed by a dry etching process in a parallel direction is relatively small in a cross-sectional region of line IV-IV' of FIG. 3 with a high pattern density. On the other hand, an amount to be consumed by a dry etching process in a perpendicular direction is relatively large in a cross-sectional region of line V-V' of FIG. 3 with a low pattern density.

When the STI isolation layer is formed to define a plurality of active region patterns 152 as in FIG. 3, the increasing maximum width of the lower trench in the major axis Y direction of the active region pattern 152 is advantageous for a specific structure of the semiconductor device. For example, a structure with a sufficient channel length is built by forming a channel along the outer surface of the trench on the active region for a recess channel formation in a recess channel array transistor (RCAT). When the maximum width of the lower trench increases in a major axis Y direction of the active region pattern, a depletion region decreases in the RCAT. Consequently, a swing property and a refresh property improve, and the limit voltage is lowered.

Figure 6:
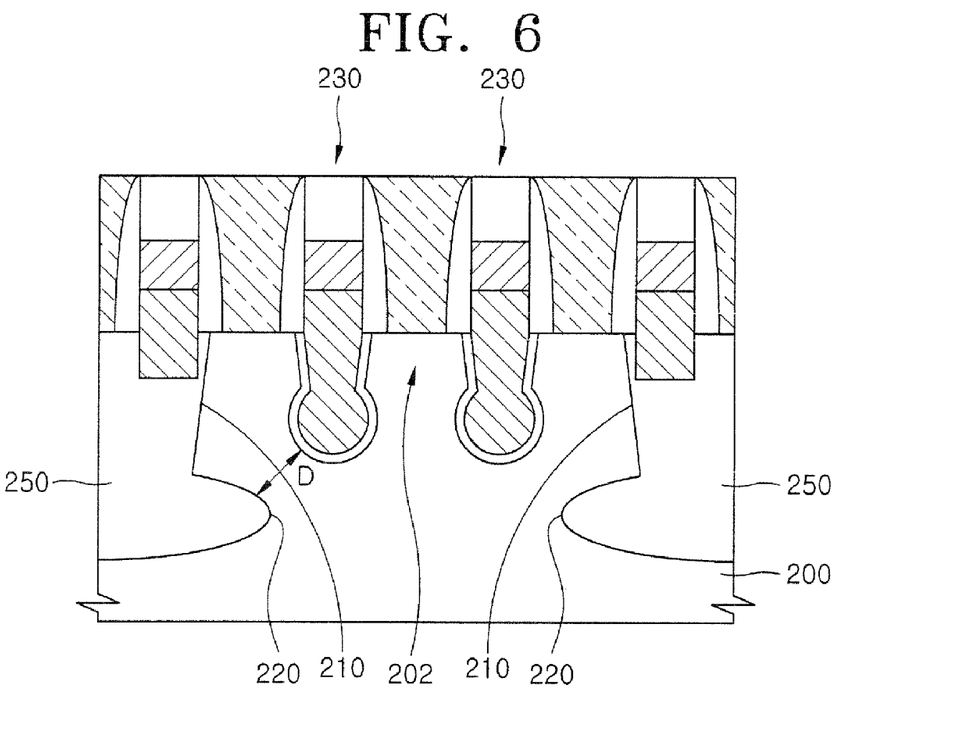
FIG. 6 is a cross-sectional view, from a direction of a major axis of an active region, of a structure of an RCAT in an active region defined on a semiconductor substrate by an isolation layer according to a still another embodiment of the present invention.

FIG. 6 is a cross-sectional view, from a major axis direction (a cross-sectional view of line V-V' in FIG. 3) of an active region 202, of a structure of an RCAT 230 in an active region 202 defined on a semiconductor substrate 200 by the STI isolation layer 250 according to an aspect of the present invention.

Referring to FIG. 6, the maximum width of the lower trench 220 is greater than the width of the upper trench 210 because an etching amount in a parallel direction increases during the isotropic dry etching process to form the lower trench 220 of the isolation layer 250. Consequently, a depletion region between the RCAT 230 and a body reduces and a complete depletion region can be partially formed like a partially insulated field effect transistor (PI-FET) implemented on a silicon on insulator (SOI) substrate because a distance D between a channel region of the RCAT 230 and the isolation layer 250 reduces.

Figure 7:
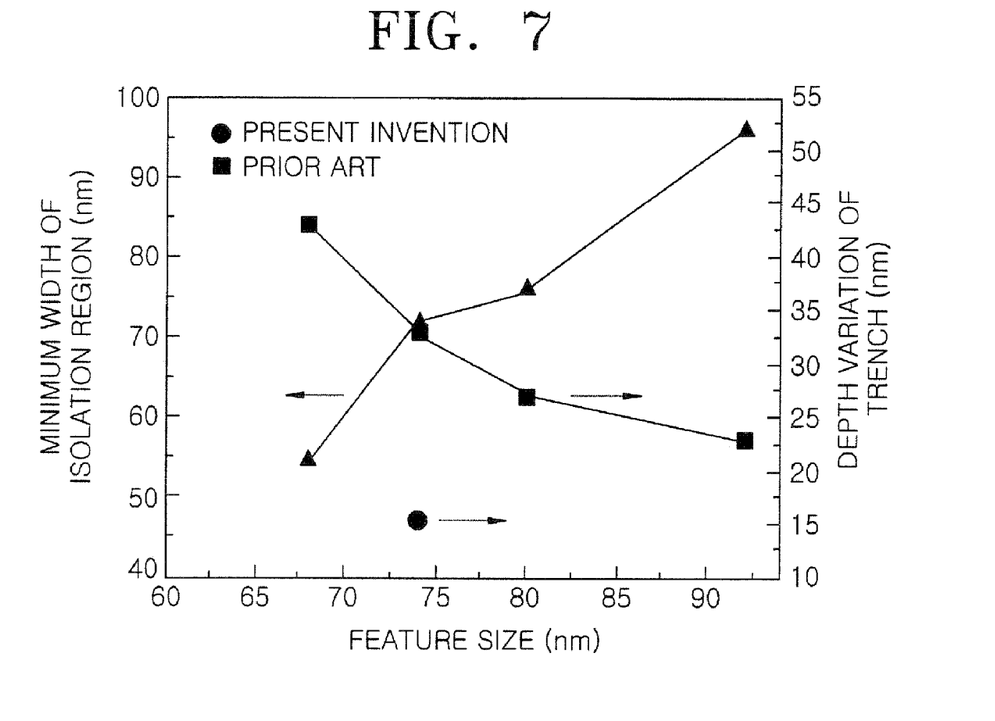
FIG. 7 is a graph illustrating uniformity test results of a trench depth for isolation when an active region is defined by an isolation layer according to yet another embodiment of the present invention.

FIG. 7 is a graph of a uniformity test result of a trench depth for isolation in a layout with an active region pattern 152 in FIG. 3 when the active region pattern 152 is defined by an isolation layer formed using the method according to one embodiment of the present invention. FIG. 7 also contains a plot of a uniformity test result of a trench depth for isolation when the active region is defined by an isolation layer formed using the method according to the prior art.

Referring to FIG. 7, when defining a plurality of active region patterns 152 using the layout in FIG. 3, the uniformity of the trench for isolation is tested by measuring the width of an isolation region ("Wmin" in FIG. 3) in the portion having the minimum width (a cross-sectional view of line IV-IV' in FIG. 3) among the isolation regions in the cell array region, according to a change in the feature size of the product, and also estimating a depth variation of a trench for isolation formed on various positions throughout the entire surface of the wafer.

Figure 8:
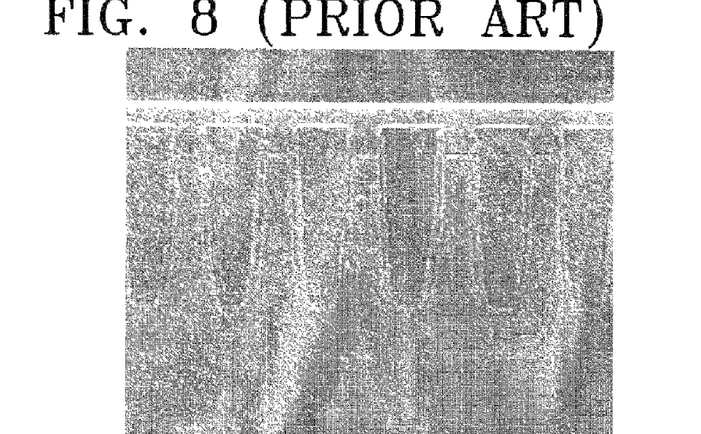
FIGS. 8 through 10 are SEM images illustrating a cross-sectional structure of a formation result of an STI isolation region formed using a conventional method to embody devices having various feature sizes.
Figure 9:
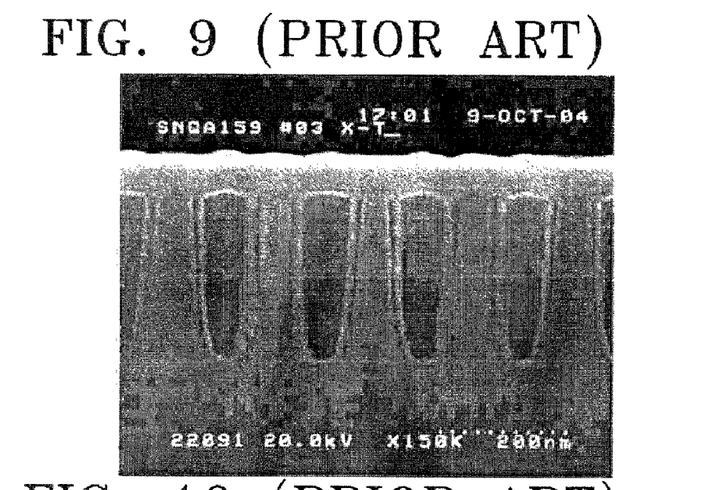
Figure 10:
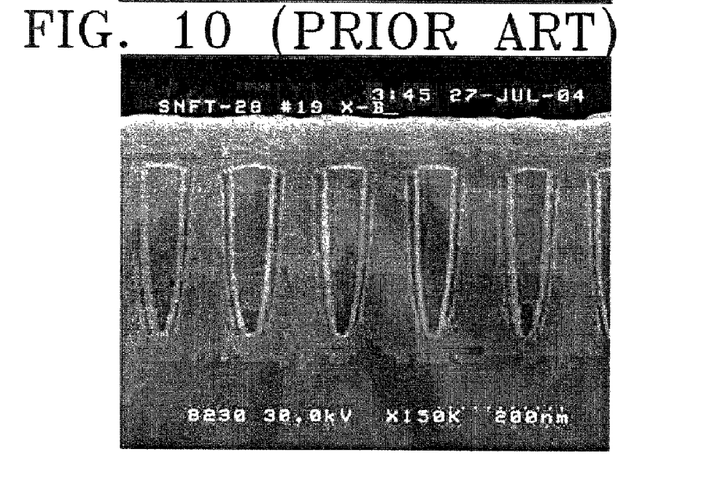

Devices having feature sizes of 68 nm, 74 nm, 80 nm, and 92 nm, respectively, are used for test samples of an isolation layer formed using the conventional method. FIGS. 8 through 10 are SEM images illustrating a cross-sectional structure of a formation result of an STI isolation region to define an active region according to the layout in FIG. 3, and to implement a device having a feature size of 92 nm, 80 nm, and 74 nm, respectively, according to the prior art. Additionally, the STI isolation region defines an active region according to the layout in FIG. 3. Each of the cross-sectional views in FIGS. 8 through 10 corresponds to line V-V' in FIG. 3. Referring to FIG. 7, with the reduction of a feature size, the width of an isolation region in a cell array region also reduces as indicated by a reference symbol ▲. Referring to FIGS. 8 through 10, with the reduction of a feature size, the bottom shape of a trench for isolation becomes sharper. Additionally, as can be seen from FIG. 7, as a feature size of a device reduces, the depth variation of a trench for isolation becomes greater as indicated by a reference symbol ■.

In summary, device having a feature size of 74 nm is used as a test sample according to one aspect of the present invention and a cross-sectional structure of an isolation region in the tested device is illustrated in FIG. 4. In FIG. 7, as indicated by a reference symbol ●, the depth variation of a trench for isolation in the same feature size (74 nm) becomes less than that of the prior art in a device having an isolation structure according to another aspect of the present invention.

An isolation layer, which defines an active region on the semiconductor substrate, is formed using the STI technology according to one embodiment of the present invention. The isolation layer is formed inside the STI trench having the upper trench formed by etching a predetermined region of the semiconductor substrate, and a lower trench connected to the bottom of the upper trench and having a round-shaped cross-sectional profile. The upper trench has an excellent gap filling property due to the positive slope of the tapered sidewalls having a positive slope when filling the upper trench with an insulating layer for isolation. Additionally, a closed void can be formed inside the lower trench according to a deposition condition of the insulating layer for isolation. An amount of induced electric charge reduces because a permittivity of the isolation layer with the void becomes lower than that of a conventional oxide layer without the void.

Accordingly, an isolation property of the present invention can be enhanced compared with an isolation layer of a conventional oxide layer. An isolation region formed using the method according to some embodiments of the present invention can improve trench depth variation formed on various positions of the entire surface of the wafer by forming the round-shaped cross-sectional profile in a lower trench using the isotropic dry etching method. Additionally, an active region can be expanded and the HEIP effect can be enhanced by forming the spacer of the oxide layer inside the inner wall of the upper trench. Moreover, a parasitic leakage current can be reduced and isolation properties can be enhanced at the same time.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a semiconductor substrate having an upper trench and a lower trench to collectively define an active region, the lower trench having a substantially curved cross-sectional profile, the lower trench being in communication with the upper trench; and
   an isolation layer formed inside the upper trench and the lower trench of the semiconductor substrate, the isolation layer comprising:
      a first insulating layer formed inside only the upper trench and covering an inner wall of the upper trench;
      a second insulating layer overlying the first insulating layer and covering an inner wall of the lower trench; and
      a third insulating layer overlying the second insulating layer and extending from the upper trench to the lower trench to define a closed void inside the lower trench,
   wherein the upper trench has a first width at an upper portion and a second width at a lower portion, the first width being greater than the second width, and the lower trench has a third width corresponding to a maximum width of the lower trench, the third width being greater than the second width and less than the first width.

2. The semiconductor device of claim 1, wherein the isolation layer is formed on the semiconductor substrate to define a plurality of active regions each having an island shape with a major axis extending in a first direction and a minor axis extending in a second direction perpendicular to the first direction on a main surface of the semiconductor substrate, and the third width is less than the first width in a minor axis direction of the active region.

3. The semiconductor device of claim 2, wherein the third width is greater than the first width in a major axis direction of the active region.

4. The semiconductor device of claim 2, wherein the major axis is longer than the minor axis.

5. The semiconductor device of claim 4, wherein the major axis and minor axis define outer boundaries of each of the island shape active regions.

6. The semiconductor device of claim 1, wherein the first insulating layer is formed of a medium temperature deposition of oxide (MTO).

7. The semiconductor device of claim 1, wherein the second insulating layer comprises a nitride liner covering the first insulating layer.

8. The semiconductor device of claim 7, wherein the third insulating layer comprises an oxide layer covering the nitride liner around the void within the lower trench.

9. The semiconductor device of claim 1, wherein the substantially curved cross-sectional profile represents a generally circular arc.

10. The semiconductor device of claim 1, wherein the upper trench has a tapered inner wall with a positive slope.

11. The semiconductor device of claim 1, wherein the void has a substantially curved cross-sectional profile having a generally circular shape.

12. A semiconductor device comprising:
    a semiconductor substrate having an upper trench and a lower trench to collectively define an active region, the lower trench having a substantially curved cross-sectional profile, the lower trench being in communication with the upper trench; and
    an isolation layer formed inside the upper trench and the lower trench of the semiconductor substrate, the isolation layer comprising:
       a first insulating layer formed inside only the upper trench and covering an inner wall of the upper trench;
       a second insulating layer overlying the first insulating layer and covering an inner wall of the lower trench;
       a third insulating layer overlying the second insulating layer and extending from the upper trench to the lower trench to define a closed void inside the lower trench; and
       a fourth insulating layer interposed between the first insulating layer and the second insulating layer in the upper trench, the fourth insulating layer being interposed directly between the substrate and the second insulating layer in the lower trench.

13. The semiconductor device of claim 12, wherein the fourth insulating layer comprises an oxide layer.

14. The semiconductor device of claim 13, wherein the fourth insulating layer is a grown oxide layer.

15. The semiconductor device of claim 12, wherein:
the first insulating layer is formed of a medium temperature deposition of oxide (MTO);
the second insulating layer comprises a nitride liner covering the first insulating layer;
the third insulating layer comprises an oxide layer covering the nitride liner around the void within the lower trench; and
the fourth insulating layer comprises an oxide layer.

* * * * *

UNITED STATES PATENT AND TRADEMARK OFFICE
CERTIFICATE OF CORRECTION

PATENT NO. : 7,622,778 B2
APPLICATION NO. : 11/383141
DATED : November 24, 2009
INVENTOR(S) : Sung-Sam Lee et al.

It is certified that error appears in the above-identified patent and that said Letters Patent is hereby corrected as shown below:

Column 4, line 12, the word "TCP" should read -- ICP --;
Column 6, line 29, the word "1100" should read -- 100 --;
Column 7, line 39, the word "10" should read -- 110 --.

Signed and Sealed this

Ninth Day of March, 2010

David J. Kappos
*Director of the United States Patent and Trademark Office*